United States Patent [19]

Colquitt et al.

[11] Patent Number: 4,801,065
[45] Date of Patent: Jan. 31, 1989

[54] CHIP CARRIER SOLDERING PALLET

[75] Inventors: Michael L. Colquitt, Palm Bay; Robert D. Gerke, Melbourne; Mark A. Kwoka; Dennis M. Foster, both of Palm Bay, all of Fla.

[73] Assignee: Harris Corporation, Melbourne, Fla.

[21] Appl. No.: 103,620

[22] Filed: Sep. 30, 1987

[51] Int. Cl.$^4$ .............................................. B23K 1/00
[52] U.S. Cl. ..................................... 228/19; 269/903; 228/57; 228/37
[58] Field of Search ..................... 228/57, 19, 37, 34, 228/21, 180.1; 269/903; 118/423, 428, 500, 422

[56] References Cited

U.S. PATENT DOCUMENTS

| | | | |
|---|---|---|---|
| 4,201,374 | 5/1980 | Gras | 269/903 |
| 4,614,294 | 9/1986 | Weaver | 228/57 |
| 4,666,077 | 5/1987 | Rahn et al. | 228/37 |
| 4,667,868 | 5/1987 | Decker et al. | 269/903 |
| 4,679,720 | 7/1987 | Sedrick, Jr. et al. | 228/37 |
| 4,720,034 | 1/1988 | Lee | 269/903 |

*Primary Examiner*—Nicholas P. Godici
*Assistant Examiner*—Karen Skillman
*Attorney, Agent, or Firm*—William A. Troner; Charles C. Krawczyk

[57] ABSTRACT

A pallet for conveying a plurality of ceramic leadless chip carriers (LCC) through an automated wave soldering machine. The pallet includes recesses formed to receive and contain the LDD's with the lid of the LCC facing into the recess. This results in protecting the lids from the molten solder. Additionally, the recesses are formed in a diamond orientation with a solderable pin placed at the trailing apex of each recess. Both the pin and the diamond orientation prevents solder build up on the trailing conductive pads, resulting in enhancing the coplanarity of the solder on the pads.

9 Claims, 2 Drawing Sheets

CHIP CARRIER SOLDERING PALLET

FIELD OF THE INVENTION

The present invention relates to semiconductor chip manufacturing and, more particularly, to the provision of solder to ceramic chip carriers. The present invention provides an improved pallet fixture used to carry multiple ceramic chip carriers through a wave soldering system.

BACKGROUND OF THE INVENTION

In the manufacture of semiconductor devices, it has become a standard practice to coat the leads of plastic chip carriers with a thin layer of solder prior to connecting the leads of the chip carrier to a circuit board. This process, commonly referred to as hot solder dipping, is done prior to mounting the chip carriers on the circuit board because it provides an easy and reliable means for soldering the leads to the board. As the carriers are mounted, the solder already present on the leads of the chip carriers is heated such that the solder reflows onto the circuit board connectors, resulting in a connection between the chip carrier and circuit board.

While the solder dipping process may be conducted in a variety of manners, the particular option of interest in the present invention is known as a wave soldering process. In this process, a bi-directional wave of molten solder is generated by a wave soldering machine such as the Hollis TDL-12 manufactured by Hollis Industries. A conveyance mechanism is provided for moving a series of the plastic leaded chip carriers (PLCC) through the molten solder wave such that the molten solder flows onto the leads. To facilitate the handling of a plurality of the chip carriers, pallet fixtures are used such as the Single Unit Plastic Leaded Chip Carrier (PLCC) manufactured by Northwest Precision Stamping Associates (NPSA).

Because of the more difficult environments in which semiconductors are being used such as those in military or space applications, the nonhermetic plastic chip carriers are not appropriate or disallowed. Rather ceramic leadless chip carriers are required for these applications. In addition to the hermiticity of the ceramic carriers, leadless ceramic chip carriers (LCC) can be made to have multiple planes of wiring in the ceramic carrier, resulting in more electrical contact points per unit area of real estate on the chip carrier. This results in a faster and more dense chip carrier unit. As with the leaded chip carriers, the conductive pads on the ceramic leadless chip carriers are hot soldered dipped.

There exist, however, several significant problems with the prior art in providing solder to the conductive pads of the leadless chip carriers. The first problem lies in the coplanarity requirements of the solder once the solder adheres to the pads of the LCC's. Because solder has a high surface tension, it tends to form bumps or beads of varying size when it adheres to the metallic pads of the leadless chip carrier. The coplanarity of the solder is the uniformity of these bumps on a single conductive pad which is determined by measuring the distance between the tangential points of the smallest and the largest bumps. The present automatic system for the PLCC's, when used for the hot solder dipping of the ceramic leadless chip carriers, have not been able to meet the standard industry and military requirements for coplanarity, and thus, nonautomated methods i.e., hand dipping, have been used to apply solder to LCC's.

As a chip carrier is passed by the molten solder wave, the solder will tend to build up on the conductive pad as the conductive pad is moved by the hot solder wave. This is a result of the surface tension of the solder now formed on the conductive pads working against the surface tension of the solder in the solder wave, thereby resulting in solder build up where the break occurs.

The second problem unique to hot solder dipping of LCC's lies in the protecting of the carrier's lid. To achieve the hermiticity of the carrier, a lid, usually formed of gold plated kovar, is sealed to a carrier base, with the carrier base containing a semiconductor device within a cavity formed in the base. One of the industry's requirements for the manufacturing of LCC's is to avoid any contact of solder with the lid, thereby maintaining a clean lid. Additionally, military specifications require that the lid not be bridged to the leads or violate package outline dimensions due to solder on the lid before acceptance of the semiconductor parts made for the military.

As indicated above, the present approach to applying solder to ceramic LCC's such that the above problems are minimized is to hand dip the ceramic leadless chip carriers individually into a bath of molten solder. An operator uses a magnetic fixture to hold and lower the single chip carrier into a flux and then into a static pot such as the Waage Melting Pot containing molten solder. The LCC is carefully lowered into the solder slightly below the surface of the solder and then rocked back and forth such that the LCC's conductive pads only are covered with solder. Although this method does successfully avoid solder from getting onto the lid of the carrier package, this method does not improve upon the coplanarity of the solder bumps to any great extent because of the build up of solder still occurring at the point where the solder on the pad of the chip carrier is detached from the bath of molten solder in the pot. Additionally, this hand dipping method is extremely time consuming and costly to implement as compared to any automated system.

It is, therefore, an object of the present invention to provide a new and improved means for applying solder to ceramic chip carriers.

It is another object of the present invention to provide a new and improved means for minimizing the noncoplanarity of the solder applied to the conductive pads of ceramic leadless chip carriers.

It is still another object of the present invention to provide a new and improved means for applying solder to the conductive pads of the ceramic leadless chip carriers while preventing solder from getting onto the lids of the leadless chip carrier package.

It is further an object of the present invention to provide a new and improved means for carrying leadless chip carriers in an automated wave soldering system.

SUMMARY OF THE INVENTION

These and other objects of the invention are attained by a new and improved pallet fixture which can carry a plurality of ceramic leadless chip carriers through an automated wave soldering system. In accordance with a preferred embodiment of the invention, a pallet fixture includes recesses formed in the surface of the pallet for retaining the chip carriers. The chip carriers are held in position in the recesses by a magnetic force via a magnet positioned on the opposing surface of the pallet.

The chip carriers are placed in the recess such that the lid of the chip carrier is contiguous with the bottom of the recess and the conductive pads facing outward of the recess. The arrangement provides the ability of protecting the lid of the chip carrier from the molten solder as the conductive pads pass across the molten solder wave. As a result of the recesses, the requirement of preventing solder from getting on the chip carrier lids can be easily met.

Also in accordance with the preferred embodiment, the recesses are oriented in a diamond orientation with respect to the front portion of the pallet.

The diamond orientation helps to minimize solder build up on the chip carrier pads as a result of the conductive pads of the carrier passing over the solder wave in such a manner that the wave completes the coverage of the conductive pad at its narrowest point.

To further substantially reduce any solder build up on the chip carrier pads, the invention further includes in a preferred embodiment a protruding device such as a pin arranged on the pallet at or near the trailing apex of the recess. The pin, which serves as a solder leveling device, causes the solder wave to break at the pin, as opposed to breaking at the end of the conductive pads of the chip carrier. Therefore, the solder break build up will occur at the pin on the pallet and not on the chip carrier pads. Consequently, the conditions which can contribute to the noncoplanarity of the chip carrier pads are eliminated.

As a result of the invention, both the requirements of coplanarity and solder-free lids are significantly improved. Also, the invention has provided a pallet fixture for ceramic chip carriers which allows for an automated hot solder dip processing without diminishing the coplanarity and solder-free lid requirements. Further, the invention can be easily applied to leaded chip carriers, as well as leadless chip carriers.

Further objects, features, and advantages of the present invention will become more apparent from the following description when taken with the accompanying drawings which show, for purposes of illustration only, an embodiment in accordance with the present invention.

BRIEF DESCRIPTIONS OF THE DRAWINGS

DETAILED DESCRIPTION OF THE DRAWINGS

Figure 1:
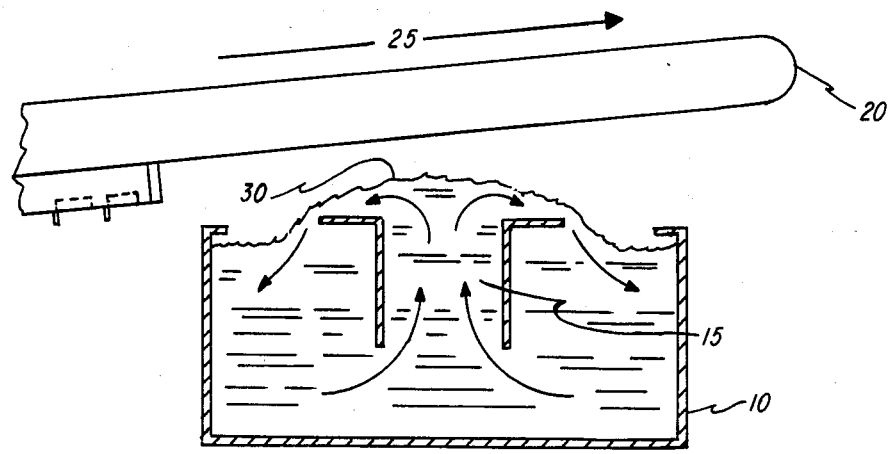
FIG. 1 is an illustration of the functional components of a typical wave soldering system.

The subject invention will now be described with reference to the accompanying drawings where FIG. 1 illustrates by way of example an automated wave soldering system. This wave soldering system includes a container unit 10 which holds a quantity of molten solder heated to approximately 225° C. The solder typically is a composition made of tin and lead. A wave generating machine (not shown) generates a bi-directional wave 30 of the molten solder. A conveyor belt or equivalent 20 provides a means for carrying the parts through the solder wave. The conveyor belt 20 revolves in the direction shown by arrow 25.

Figure 2:
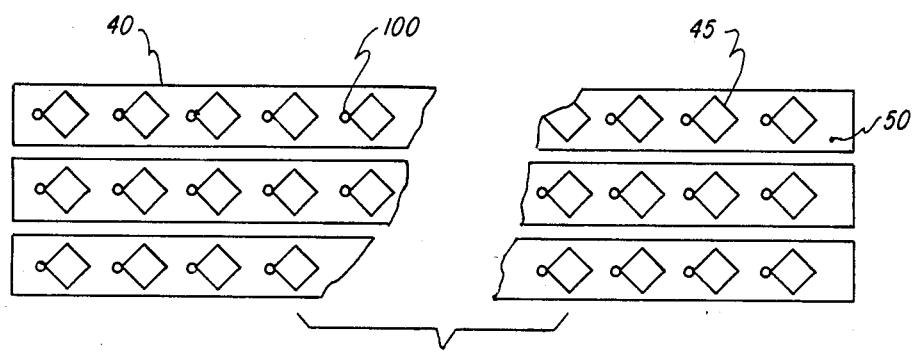
FIG. 2 is a bottom view of a preferred embodiment of the invention.

FIG. 2 illustrates a bottom view of a preferred embodiment of the pallet 40. The pallet is designed to carry a plurality of chip carrier units through the molten solder wave on the conveyor belt 20. The size of the pallet 40 may vary depending upon the size of the conveyor belt 20, but will typically be 10 inches by 18 inches for the Hollis TDL-12 type wave soldering machine. For this size pallet, up to 105 chip carrier units can be hot solder dipped in one run through the wave soldering machine. The pallet 40 is made of nonsolderable material such as titanium so that the molten solder will not attach itself to the pallet as the pallet is conveyed through the molten wave of solder.

Figure 3:
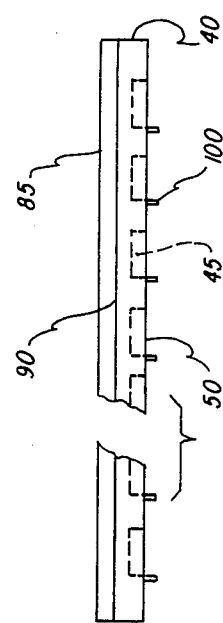
FIG. 3 is a side view illustrating the preferred embodiment of the invention, as shown in FIG. 1.
Figure 5:
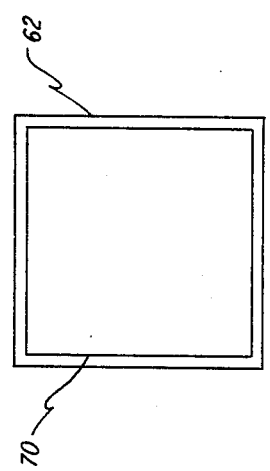
FIG. 5 is a top view of the LCC shown in FIG. 3.

As illustrated in FIG. 2, a plurality of recesses 45 are formed in the bottom surface 50 of the pallet 40 for receiving the chip carrier units 55 therein. The size of each recess 45 should be sufficiently large to accommodate a chip carrier unit 55. A typical size of a ceramic leadless chip carrier is approximately 0.350 inches by 0.350 inches. The depth of each recess 45 as shown in FIG. 3 by dashed lines, should be sufficiently deep such a chip carrier unit 55 fits within the recess 45. The typical height of the chip carrier 25 is approximately 0.080 inches, and thus, a corresponding pallet 40 will require recesses 45 having a depth of at least 0.060 inches.

Figure 4:
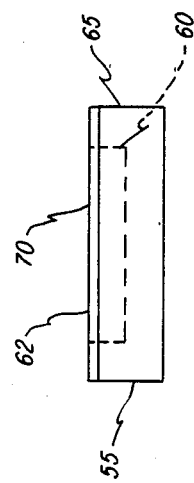
FIG. 4 is a side view of a ceramic leadless chip carrier (LCC).
Figure 6:
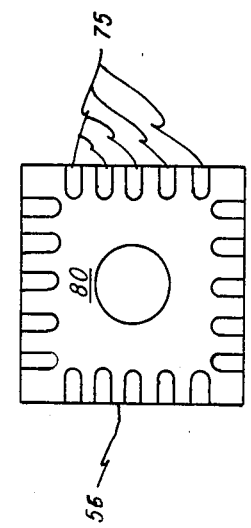
FIG. 6 is a bottom view of the LCC shown in FIG. 3.

The ceramic leadless chip carrier (LCC) 55 is commonly square in shape, although alternative rectangle shapes of LCC's are made. The chip carrier itself, as illustrated in FIG. 4, generally includes a recess 60 formed in the top surface 62 of the ceramic body 65. A die containing the semiconductor (not shown) is placed in the recess and hermetically sealed therein by a lid covering 70. Prior to covering the recess, the connecting points on the die (not shown) are connected to respective conductive pads 75 formed on a bottom side 80 of the chip carrier package 55. The lid covering 70 is typically made of metal such as gold plated kovar.

Once hermetically sealed, the LCC 55 is inserted in the recess 45 of the pallet 40 such that the lid 70 is facing inward toward in the recess and the conductive pads 75 are exposed facing outward of the recess. A magnet 85 is attached to the top surface 90 of the pallet 40 such that the chip carriers 45 are magnetically held in place in the recesses 45 via the magnetic force on the metal lids 70. Although a clip or clamp (not shown) can be alternatively used to hold the chip carriers in the recesses 45, the magnet 85 is considered the better method because it will not interfere with the solder flowing onto the conductive pads 75. The seating of the leadless chip carrier 55 into the recess in the pallet with the magnetic force holding the carrier in place completely masks and protects the lid from the molten solder, regardless of the depth immersion of the pallet 40.

The recesses 45 in the pallet 40 are further designed such that two of the four corners of the recesses are arranged on the longitudinal axis of the pallet 40. A cylindrical pin 100 formed of solderable material such as brass or copper, is provided adjacent to each of the trailing apexes of the diamond oriented recesses 45. The pins 100 are approximately one-sixteenth to one-eighth inch in diameter and approximately one-quarter to three-eights inches tall.

The combination of the pin 100 and the diamond orientation of the recesses 45, ensure coplanarity of the solder on the conductive pads 75 after the hot solder dipping of the carrier. When the conductive pads are passed by a wave of molten solder, the surface forces of the solder tend to cause beading or balling up at the point where the solder on the conductive pads and wave of molten solder wave separate. The pallet, therefore, is designed such that the beading up of solder is prevented from occurring on the conductive pads.

The diamond orientation of the recesses 45 with respect to the longitudinal axis of the pallet reduces the potential build up of solder by reducing the area of the pad 75, where the separation will occur. By having the recesses oriented diagonally, the square conductive pads on the chip carriers are also oriented diagonally. Thus, the corners of the pads 75 are arranged at the separation point of the molten solder, as opposed to the sides of the conductive pads. Additionally, the solderable pins 100 arranged at the respective trailing apexes of the recesses 45 act as solder leveling devices by drawing off the solder from the trailing corner of the conductive pads, and cause the separation of the molten solder wave and solder formed on the chip carrier to occur at the pin instead of on the conductive pads themselves. The pin 100 removes the excess solder that is typically left on the last few conductive pads of the chip carrier. As a result, beading up of solder occurring at the separation point occurs harmlessly on the solderable pin 100 and not on the chip carrier conductive pads 75. Coplanarity is thereby significantly improved by reducing the height difference between the largest and smallest solder bumps.

Also as a result, ceramic LCC's can now be hot solder dipped using automated wave soldering equipment. This increases the capacity of hot soldering dipping by at least a factor of ten when compared to the hand operator dipping presently used in the art. Additionally, the invention includes features which prevent solder from reaching the lids of the chip carriers independent from the level of submersion. Further, the invention significantly improves the coplanarity of the solder on the pads over any previous method of hot solder dipping of LCC's.

Although the invention is described for use with ceramic leadless chip carriers (LCC's), the advantages of this pallet are equally effective when used with any other type of ceramic or equivalent carriers, leaded or otherwise. Also, the illustration is not to be taken as a limitation as to dimensions or composition of the pallet invention.

Although the present invention has been described and illustrated in detail, it is to be clearly understood that the same is by way of illustration and example only, and is not to be taken by way of limitation. The spirit and scope of the present invention are to be limited only by the terms of the appended claims.

We claim:

1. An improvement in a pallet fixture of the type used to carry at least one electronic component through a wave soldering system comprising:
a pin made of solderable material, wherein said pin is arranged mounted on said bullet adjacent to said electronic component such that excess solder is removed from the electronic component by said pin as the electronic component is passed through a solder wave.

2. The pallet fixture of claim 1, wherein said pallet fixture includes a recess for retaining said electronic component.

3. The pallet fixture of claim 2, wherein said recess is oriented such that a diagonal axis of said recess is parallel with a longitudinal axis of said pallet fixture, wherein said pin is positioned adjacent to a trailing apex of said recess.

4. The pallet fixture of claim 3, further including a holding means for retaining said electronic component on said recess as said pallet fixture is passed through said wave soldering system.

5. The pallet fixture of claim 4, wherein said holding means includes a magnet arranged on a side of said pallet fixture opposing said recess.

6. A pallet fixture for carrying in a wave soldering machine, a plurality of chip carriers having electrical contact means, said pallet fixture comprising:
platform means for supporting said plurality of chip carriers, said platform means including recesses formed therein, wherein said chip carriers fit into said recesses such that said electrical contact means are exposed when said chip carriers are in said recesses; and
means protruding from mid-platform adjacent each of said recesses, wherein said protruding means removes excess solder from said electrical contact means of said chip carriers as said chip carriers are passed through a solder wave.

7. The pallet fixture of claim 6, wherein said recesses are oriented such that a diagonal axis of said recesses are parallel with a longitudinal axis of said pallet fixture, wherein said protruding means is positioned at a trailing apex of said recess.

8. The pallet fixture of claim 7, wherein said protruding means comprises a pin formed of solderable material.

9. An improved wave soldering arrangement comprising:
means for flowing molten solder over a specified area;
means for conveying chip carriers through said molten solder, said conveying means including:
fixture means having a first surface with recesses formed therein, wherein said chip carriers are arranged in said recesses, wherein said recesses are oriented diagonally with respect to the longitudinal axis of said fixture means;
wherein said fixture means includes a means protruding from said first surface, said protruding means arranged at an apex of each of said diagonal oriented recesses such that said protruding means removes excess solder from said chip carriers as said chip carriers are passed through said flowing molten solder.

* * * * *